(12) United States Patent
DeCusatis et al.

(10) Patent No.: US 6,738,187 B2
(45) Date of Patent: May 18, 2004

(54) SEMICONDUCTOR OPTICAL AMPLIFIERS USING WAVELENGTH LOCKED LOOP TUNING AND EQUALIZATION

(75) Inventors: Casimer Maurice DeCusatis, Poughkeepsie, NY (US); Lawrence Jacobowitz, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 09/893,043

(22) Filed: Jun. 27, 2001

(65) Prior Publication Data

US 2003/0002141 A1 Jan. 2, 2003

(51) Int. Cl.$^7$ ................................................ H01S 3/00
(52) U.S. Cl. ........................................ 359/344; 359/337
(58) Field of Search ................................. 359/344, 337

(56) References Cited

U.S. PATENT DOCUMENTS 4,736,164 A * 4/1988 Henning ...................... 330/4.3

OTHER PUBLICATIONS

"Introduction to DWDM Technology Data in a Rainbow", by Stamatios V. Kartalopoulos, Lucent Technologies, IEEE Communications Society, Sponsor, SPIE Optical Engineering Press, pp. 65–68.

"Introduction to DWDM Technology Data in a Rainbow", by Stamatios V. Kartalopoulos, Chapter 9, pp. 131–136.

"Distributed feedback semiconductor lasers", by John Carroll, et al., IEE Circuits, Devices and Systems Series 10, SPIE Press Monograph vol. PM52, 1998, pp. 7–15.

"Micromachining system accommodates large wafers", by Robert Bann, et al., Laser Focus World, The 2001 Annual Survey of the Laser Marketplace, PennWell, Jan. 2001, pp. 189–192.

* cited by examiner

*Primary Examiner*—Mark Hellner
(74) *Attorney, Agent, or Firm*—Scully, Scott, Murphy & Presser; Tiffany L. Townsend, Esq.

(57) ABSTRACT

A system and method for improving optical signal gain efficiencies of semiconductor optical amplifier devices. The system and method exploits a wavelength-locked loop servo-control circuit and methodology that enables real time mutual alignment of the center wavelength of an optical signal having a peaked spectrum function and transmitted through the semiconductor optical amplifier, and a center wavelength of a wavelength selective device such as an optical filter implementing a peaked passband function in an optical system. The wavelength-locked loop servo-control circuit and methodology may be further exploited to control various types of modulation applied to the optical signals transmitted in optical systems.

38 Claims, 8 Drawing Sheets

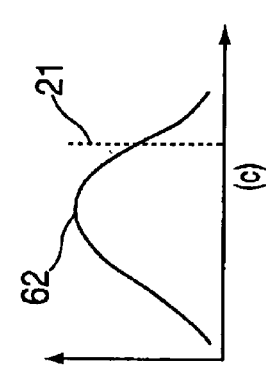
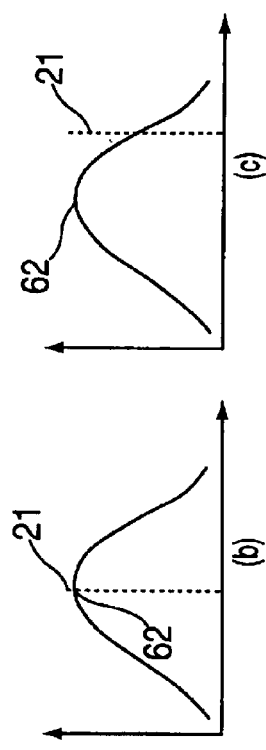
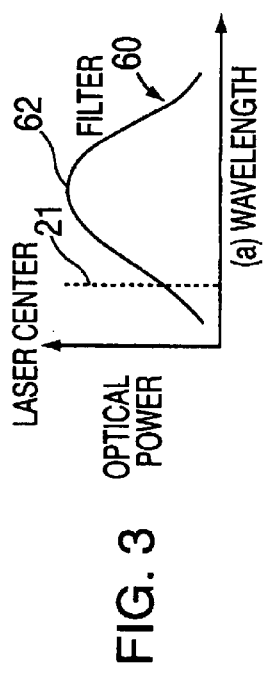
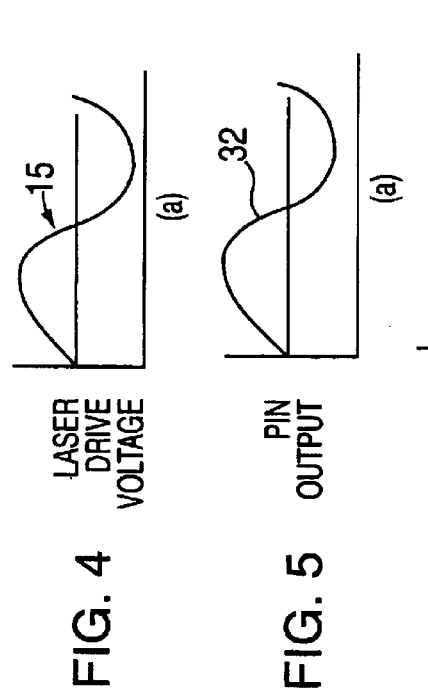
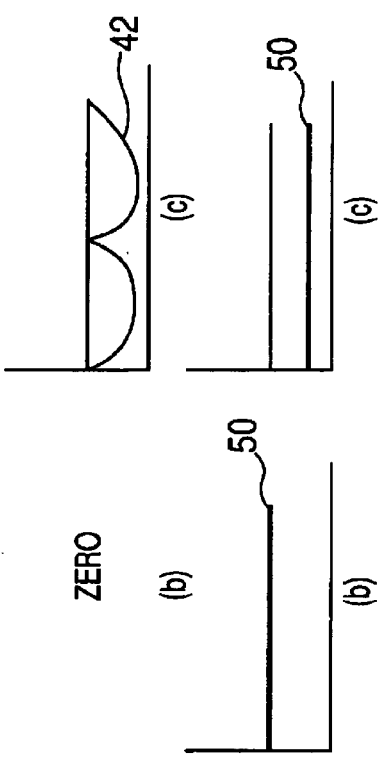
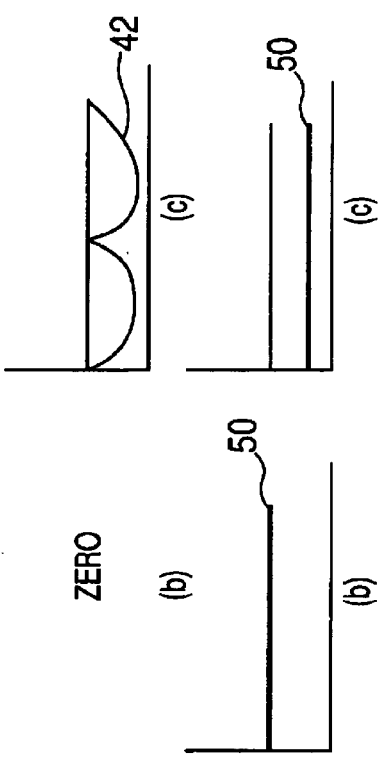

SEMICONDUCTOR OPTICAL AMPLIFIERS USING WAVELENGTH LOCKED LOOP TUNING AND EQUALIZATION

BACKGROUND OF THE INVENTION

1. Field of the Invention

The present invention relates generally to optical devices such as lasers, and fiber optic data transmission systems employing the same, and particularly to a novel wavelength-locked loop servo-control circuit for optimizing performance of semiconductor optical amplifiers.

2. Description of the Prior Art

Wavelength Division Multiplexing (WDM) and Dense Wavelength Division Multiplexing (DWDM) are light-wave application technologies that enable multiple wavelengths (colors of light) to be paralleled into the same optical fiber with each wavelength potentially assigned its own data diagnostics. Currently, WDM and DWDM products combine many different data links over a single pair of optical fibers by re-modulating the data onto a set of lasers, which are tuned to a very specific wavelength (within 0.8 nm tolerance, following industry standards). On current products, up to 32 wavelengths of light can be combined over a single fiber link with more wavelengths contemplated for future applications. The wavelengths are combined by passing light through a series of thin film interference filters, which consist of multi-layer coatings on a glass substrate, pigtailed with optical fibers. The filters combine multiple wavelengths into a single fiber path, and also separate them again at the far end of the multiplexed link. Filters may also be used at intermediate points to add or drop wavelength channels from the optical network.

Optical communication links in systems employing WDM or, optical networks in general, require amplification to extend their distances. For example, optical signal amplification are needed in optical links for applications such as disaster recovery in a storage area network or parallel sysplex. There are many types of amplifiers, however, for some wavelength ranges of interest, semiconductor optical amplifier devices (SOAs) have emerged as being extremely useful. An SOA functions much like an in-line semiconductor laser diode in that it is optically pumped for amplifying incoming optical signals without requiring optical/electrical conversions. However, the SOA also broadens the optical spectrum of the amplified light, which may induce undesired effects such as dispersion and modal noise that limit the effectiveness of this technology.

Particularly, as illustrated in FIG. 1, the basic SOA device 100 (also known as a semiconductor laser amplifier or "SLA") is very similar in construction to a Fabry Perot semiconductor laser diode, comprising semiconductive layers 110, 111 and an active layer 112 forming an optical cavity which receives an input optical signal 120. Generally, when an electrical current 115 is pumped through the device, electrons are excited in the optical cavity 112 to effect gain of the input signal 120 in the direction of propagation. The output optical signal 130 is thus an amplified version of the input signal. It is understood that mirrors may be implemented in the optical cavity for increasing the effective path length through the gain medium, and hence increase the overall gain. The SOA offers potential advantages over other optical amplification technologies such as doped fiber amplifiers. In particular, the SOA can be monolithically integrated with other semiconductor devices on a common chip or substrate, e.g., GaAs or hybrid Si on insulator, and mass produced at low cost. SOAs can easily amplify light at various wavelengths, including 1300 nm and 850 nm which is a unique feature, since erbium doped fiber amplifiers (EDFAs) operate only at wavelengths near 1550 nm, and more exotic doped fiber amplifiers at other wavelengths are more expensive and difficult to manufacture. This is an important advantage, as the SOA is a low cost solution to amplify the 1300 nm and 850 nm windows most commonly used in data communication systems such as ESCON, Fibre Channel, and Gigabit Ethernet. The SOA is also a very compact and highly reliable device. However, an SOA differs from a laser diode in that the SOA operates below the threshold current required for laser action. (In a variant design, the traveling wave SOA, may be operated above threshold but has other design and manufacturing problems which have so far prevented its becoming a commercially available device). Due to this, the light emerging from an SOA has a very broad spectral width, around 20–50 nm and, in some cases, several hundred nanometers, as opposed to a typical narrowband laser which has about 2–3 nm spectral width. Thus, an optical signal entering the SOA will be amplified, but suffers a significant spectral broadening; the additional optical power is spread across a much wider frequency range. Not only is this an inefficient way to amplify the light, but the spectral broadening causes secondary effects such as increased dispersion, modal noise, and mode partition noise on the communication link; these noise sources can exhibit a noise floor, which means that the noise limits the maximum link distance regardless of the strength of the amplified signal. For this reason, SOAs have not been widely deployed in very long distance links, although they have found applications in shorter data and telecommunication systems.

Furthermore, if the SOA is operated at higher voltages or currents (still below threshold), the gain increases and the spectral broadening becomes worse. In principle, the SOA output may be optically filtered with a narrow band element such as an array waveguide grating or multilayer thin film interference filter, as these devices can be integrated onto the semiconductor substrate. However, such filters are very difficult to fabricate with their center wavelength exactly aligned to the peak of the SOA output spectrum, hence they have unacceptably high insertion loss (up to several dB) which cancels out the gain of the optical amplifier. Further complicating the problem, the SOA tends to have a high insertion loss, as well as high spontaneous emission noise due to random generation of photons at the amplified wavelengths. The SOA spectrum also drifts with changes in temperature or bias voltage, as well as with the aging of the SOA diode.

It would thus be highly desirable to provide a system and method for automatically compensating for the undesirable effects of an SOA, and particularly a system and method for overcoming the spectral broadening associated with SOA devices.

It would thus be highly desirable to provide a servo-control feedback loop for stabilizing the SOA output and tracking the center wavelength of the amplified signal to the peak of an optical filter passband with high accuracy to enable higher gains than currently achievable with SOAs.

SUMMARY OF THE INVENTION

It is therefore an object of the present invention to provide a system and method for overcoming the spectral broadening associated with semiconductor optical amplifier (SOA) devices.

It is another object of the present invention to provide a servo-control loop for implementation in an SOA device that enables for dynamic tracking of the center wavelength of the amplified signal to the peak of an optical filter passband with high accuracy.

It is a further object of the present invention to provide a servo-control loop for implementation in an SOA device that provides stabilization of the SOA output and provides tracking of the center wavelength of the amplified signal to the peak of an optical filter passband to enable higher gains than currently achievable with SOAs.

It is another object of the present invention to provide a servo-control loop for implementation in an SOA device that is implemented on a common semiconductor substrate and thus may be integrated with the SOA diode design.

It is still another object of the present invention to provide a servo/feedback loop, referred to as a "wavelength-locked loop," that provides stabilization of the SOA output and provides tracking of the center wavelength of the amplified signal to the peak of an optical filter passband to enable higher gains, thereby enabling significantly larger link power budgets and longer supported distances in fiber optic data communication systems.

It is yet still another object of the present invention to provide a servo/feedback loop, referred to as a "wavelength-locked loop," in an optical transmission system, that may be implemented for modulating the amplitude, phase, and/or frequency of an optical signal.

It is a further object of the present invention to provide a servo/feedback loop, referred to as a "wavelength-locked loop," in an optical transmission system, that enables application of several different types of modulation to an optical signal, including digital data modulation, analog modulation, and may be used for analog-to-digital conversion, or digital-to-analog conversion applications.

It is still a further object of the present invention to provide a servo/feedback loop, referred to as a "wavelength-locked loop," in an optical transmission system, that provides for binary modulation of an optical signal in addition to multi-level signaling.

Thus, according to one aspect of the invention, there is provided a system and method for improving gain efficiency in a semiconductor optical amplifier, the method comprising steps of: receiving an input optical signal to be amplified; providing a bias signal for input to a semiconductor optical amplifier and generating an amplified output optical signal from the input optical signal having a peaked spectrum function including a center wavelength according to an input bias signal value; providing an optical filter element for passing output optical signals amplified by the semiconductor optical amplifier device, the optical filter element exhibiting a peaked passband function including a center wavelength; and, providing automatic real-time mutual alignment of the center wavelength of the amplified optical signal output with the optical filter having the peaked passband function so that the output optical signal is maximally transferred through the optical filter element, thereby resulting in increased semiconductor optical amplifier gain According to another aspect of the invention, there is provided a system and method for modulating an optical signal characterized as a peaked spectrum function having a center wavelength and employed in an optical system including a wavelength selective device implementing a peaked passband function having a center wavelength for passing the optical signal, the method comprising the steps of: applying a dither modulation signal at a dither modulation frequency to the optical signal, and inputting the dither modulated optical signal to the wavelength selective device; converting a portion of the dither modulated optical signal to a feedback signal; continuously comparing a frequency characteristic of the feedback signal with the dither modulation signal and generating an error signal representing a current offset amount between the peaked spectrum function center wavelength of the optical signal and the peaked passband function center wavelength of the wavelength selective device, the current offset amount indicating a degree of modulation of the optical signal communicated in the system; receiving a data information signal to be communicated in the optical system and comparing a difference between a desired offset amount associated with each data information signal to be communicated and the current offset amount; dynamically adjusting the center wavelength of the optical signal according to the offset difference for achieving the desired offset amount between the peaked spectrum function center wavelength of the optical signal and the peaked passband function center wavelength of the wavelength selective device, wherein the optical signal is modulated according to the desired offset amount.

Advantageously, the system and methods of the present invention enables the widespread application of SOAs, and, optical amplifiers in general, in data communication systems. Furthermore, all the components of the feedback loop may easily be fabricated on a common semiconductor substrate using standard photolithographic methods, and thus may be integrated with the SOA diode design. Further, the implementation of the wavelength-locked loop for providing modulation of optical signals according to the invention, is advantageous for application areas such as radar and sonar signal processing, image sampling and transmission, holographic storage, and other areas which today exploit externally modulated optical generators, e.g., laser diodes.

BRIEF DESCRIPTION OF THE DRAWINGS

Further features, aspects and advantages of the apparatus and methods of the present invention will become better understood with regard to the following description, appended claims, and the accompanying drawings where:

FIGS. 3(a)–3(b) are signal waveform diagrams depicting the relationship between laser optical power as a function of wavelength for three instances of optic laser signals;

FIGS. 4(a)–4(c) are signal waveform diagrams depicting the laser diode drive voltage dither modulation (a sinusoid) for each of the three waveform diagrams of FIGS. 3(a)–3(c);

FIGS. 5(a)–5(c) are signal waveform diagrams depicting the resulting feedback error signal output of the PIN diode for each of the three waveform diagrams of FIGS. 3(a)–3(c);

FIGS. 6(a)–6(c) are signal waveform diagrams depicting the cross product signal resulting from the mixing of the amplified feedback error with the original dither sinusoid;

FIGS. 7(a)–7(c) are signal waveform diagrams depicting the rectified output laser bias voltage signals which are fed back to adjust the laser current and center frequency;

DETAILED DESCRIPTION OF PREFERRED EMBODIMENTS

The present invention is directed to a semiconductor optical amplifier ("SOA") implementing a novel servo-control loop for providing a stable, optical output signal at a desired wavelength to stabilize the SOA output and track the center wavelength of the amplified signal to the peak of an optical filter passband with high accuracy. This will enable higher gains than currently achievable with SOAs. Furthermore, all the components of the feedback loop can easily be fabricated on a common semiconductor substrate using standard photolithographic methods, and thus be integrated with the SOA diode design.

Figure 2A:
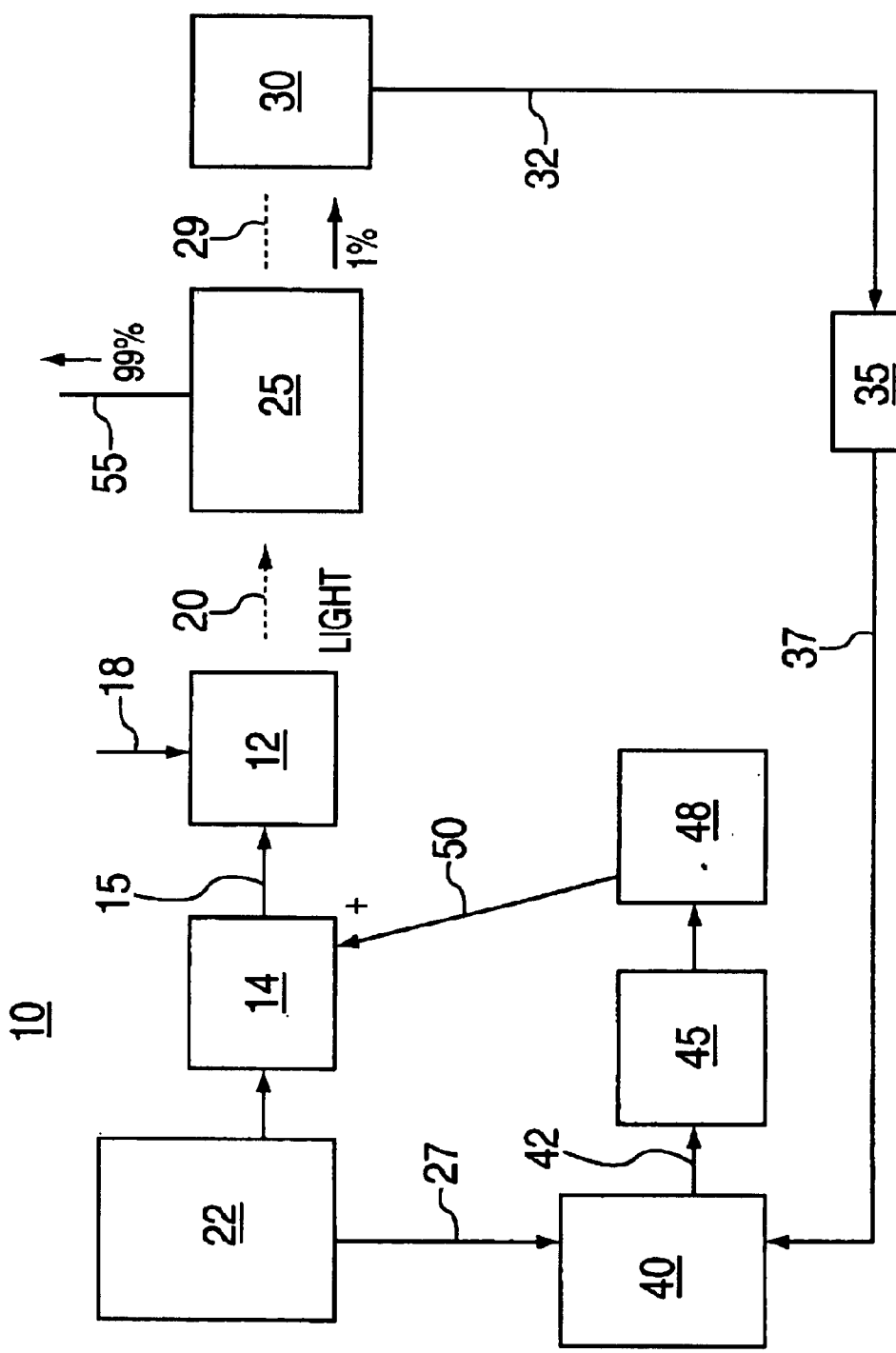
FIGS. 2(a) and 2(b) depict examples underlying wavelength-locked loop system architectures.

As shown in FIG. 2(a), the novel servo-control system implements a principle referred to herein as the "wavelength-locked loop" or "lambda-locked loop" (since the symbol lambda is commonly used to denote wavelength). The basic operating principle of the wavelength-locked loop (WLL) is described in greater detail in commonly-owned, co-pending U.S. patent application Ser. No. 09/865,256 entitled APPARATUS AND METHOD FOR WAVELENGTH-LOCKED LOOPS FOR SYSTEMS AND APPLICATIONS EMPLOYING ELECTROMAGNETIC SIGNALS, the whole contents and disclosure of which is incorporated by reference as if fully set forth herein.

Particularly, as described in commonly-owned, co-pending U.S. patent application Ser. No. 09/865,256, and with reference to FIG. 2(a), the wavelength-locked loop principle implements a dither modulation to continuously adjust an electromagnetic signal source characterized as having a peaked frequency spectrum or peaked center wavelength, e.g., a laser light source, so as to track the center of a frequency selective device, e.g. a filter passband. In this manner, optimal power of the signal is transmitted and optimal use is made of the system transmission bandwidth. The principle may be exploited for tuning any light source having a peaked frequency spectrum, and additionally, may be used to tune or adjust transmission properties of frequency selective devices such as tunable filters.

For purposes of description, the basic operating principle of the WLL is shown in FIG. 2(a) which depicts an example optic system 10 including a light source such as laser diode 12 driven with both a bias voltage 15 from a voltage bias circuit 14, and modulated data 18 from a data source (not shown). The laser diode generates an optical (laser light) signal 20 that is received by a bandpass filter 25 or, any frequency selective device including but not limited to: thin film optical interference filters, acousto-optic filters, electro-optic filters, diffraction gratings, prisms, fiber Bragg gratings, integrated optics interferometers, electroabsorption filters, and liquid crystals. The laser diode itself may comprise a standard Fabry Perot or any other type (e.g., Vertical Cavity Surface Emitting (VCSEL)), light emitting diodes, or, may comprise a Distributed Feedback semiconductor laser diode (DFB) such as commonly used for wavelength multiplexing. Preferably, the laser diode emits light in the range of 850 nm to 1550 nm wavelength range. As mentioned, the bandpass filter may comprise a thin film interference filter comprising multiple layers of alternating refractive indices on a transparent substrate, e.g., glass. As further shown in FIG. 2(a), according to the invention, there is an added sinusoidal dither modulation circuit or oscillator 22 for generating a sinusoidal dither modulation signal 27 that modulates the laser bias voltage. The sinusoidal dither signal may be electronically produced, e.g., by varying the current for a laser, or mechanically, by varying the micro-electromechanical system's (MEMS) mirror to vary the wavelength. The dither modulation frequency is on the order of a few kilohertz (kHz) but may range to the Megahertz range. Preferably, the dither modulation frequency is much less than the data rate which is typically on the order of 1–10 GHz. Modulation of the laser diode bias current 15 in this manner causes a corresponding dither in the laser center wavelength. Modulated data is then imposed on the laser, and the optical output passes through the bandpass filter 25. Preferably, the filter 25 is designed with a splitter device (not shown) to tap off a small amount of light 29, for example, which is incident upon a photo detector receiver device, e.g., P-I-N diode 30, and converted into an electrical feedback signal 32. The amount of light that may be tapped off may range anywhere between one percent (1%) to five percent (5%) of the optical output signal, for example, however, skilled artisans will appreciate any amount of laser light above the noise level that retains the integrity of the output signal including the dither modulation characteristic, may be tapped off. The remaining laser light passes on through the filter 25 to the optical network (not shown). As the PIN diode output 32 is a relatively weak electric signal, the resultant feedback signal is amplified by amplifier device 35 to boost the signal strength. The amplified electric feedback signal 37 is input to a multiplier device 40 where it is combined with the original dither modulation signal 35. The cross product signal 42 that results from the multiplication of the amplified PIN diode output (feedback signal) 37 and the dither signal 35 includes terms at the sum and difference of the dither frequencies. The result is thus input to a low pass filter device 45 where it is low pass filtered and then averaged by integrator circuit 48 to produce an error signal 50 which is positive or negative depending on whether the laser center wavelength is respectively less than or greater than the center point of the bandpass filter. The error signal 50 is input to the laser bias voltage device 15 where it may be added (e.g., by an adder device, not shown) in order to correct the laser bias current 15 in the appropriate direction. In this manner, the bias current (and laser wavelength) will increase or decrease until it exactly matches the center of the filter passband. Alternately, the error signal 50 may be first converted to a digital form, prior to input to the bias voltage device.

Figure 2B:
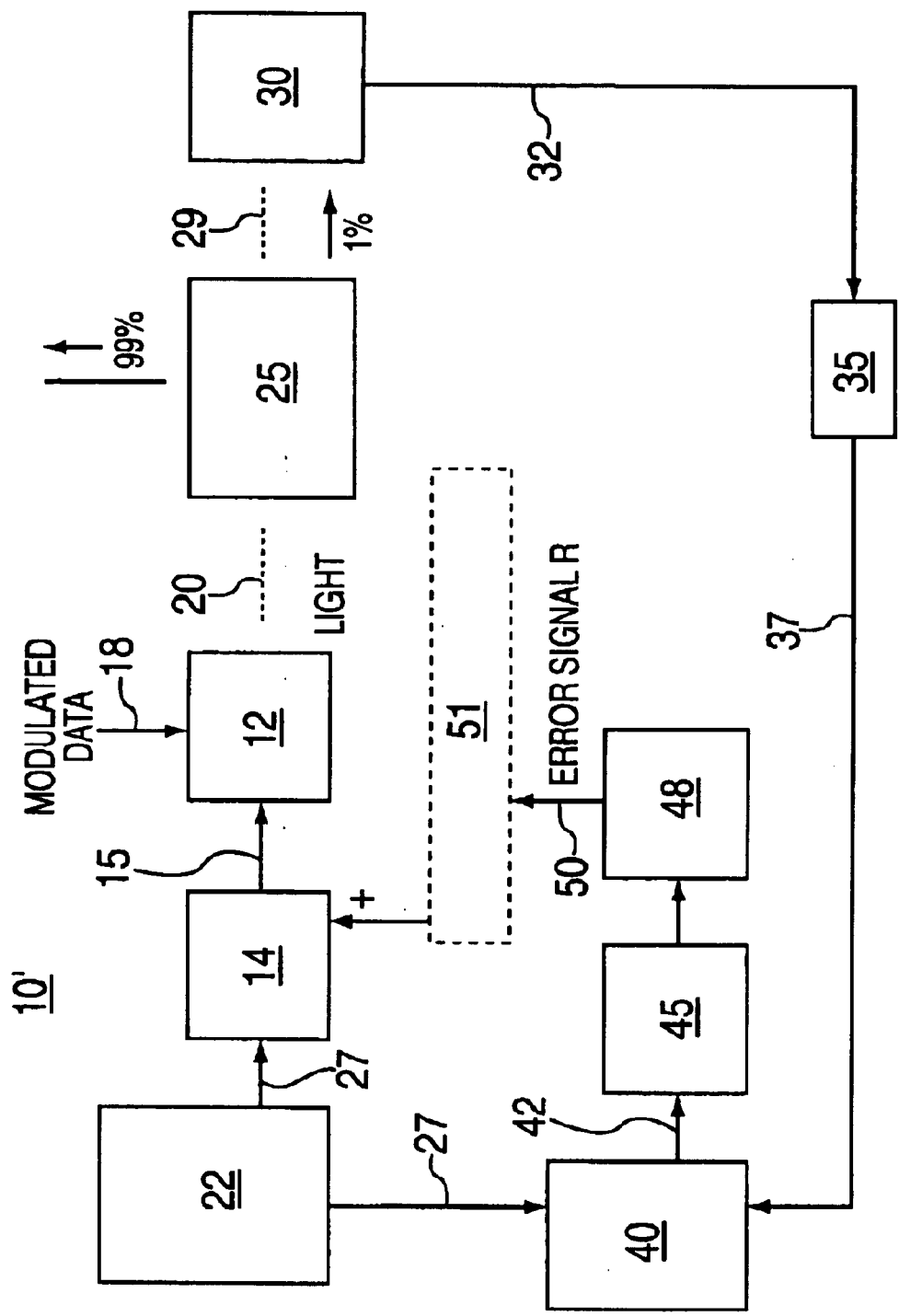

According to one aspect of the invention, the WLL will automatically maintain tracking of the laser center wavelength to the peak of the optical filter. However, in some cases, it may not be desirable to enable laser alignment to the filter peak, e.g., in an optical attenuator. Thus, as shown in FIG. 2(b) which is a system 10' corresponding to the system 10 of FIG. 2(a), there is provided an optional external tuning circuit, herein referred to as a wavelength shifter device 51, that receives the error signal and varies or offsets it so that the laser center wavelength may be shifted or offset in a predetermined manner according to a particular network application. That is, the wavelength shifter 51 allows some external input, e.g., a manual control element such as a knob, to introduce an arbitrary, fixed offset between the laser center wavelength and the filter peak.

Figure 2C:
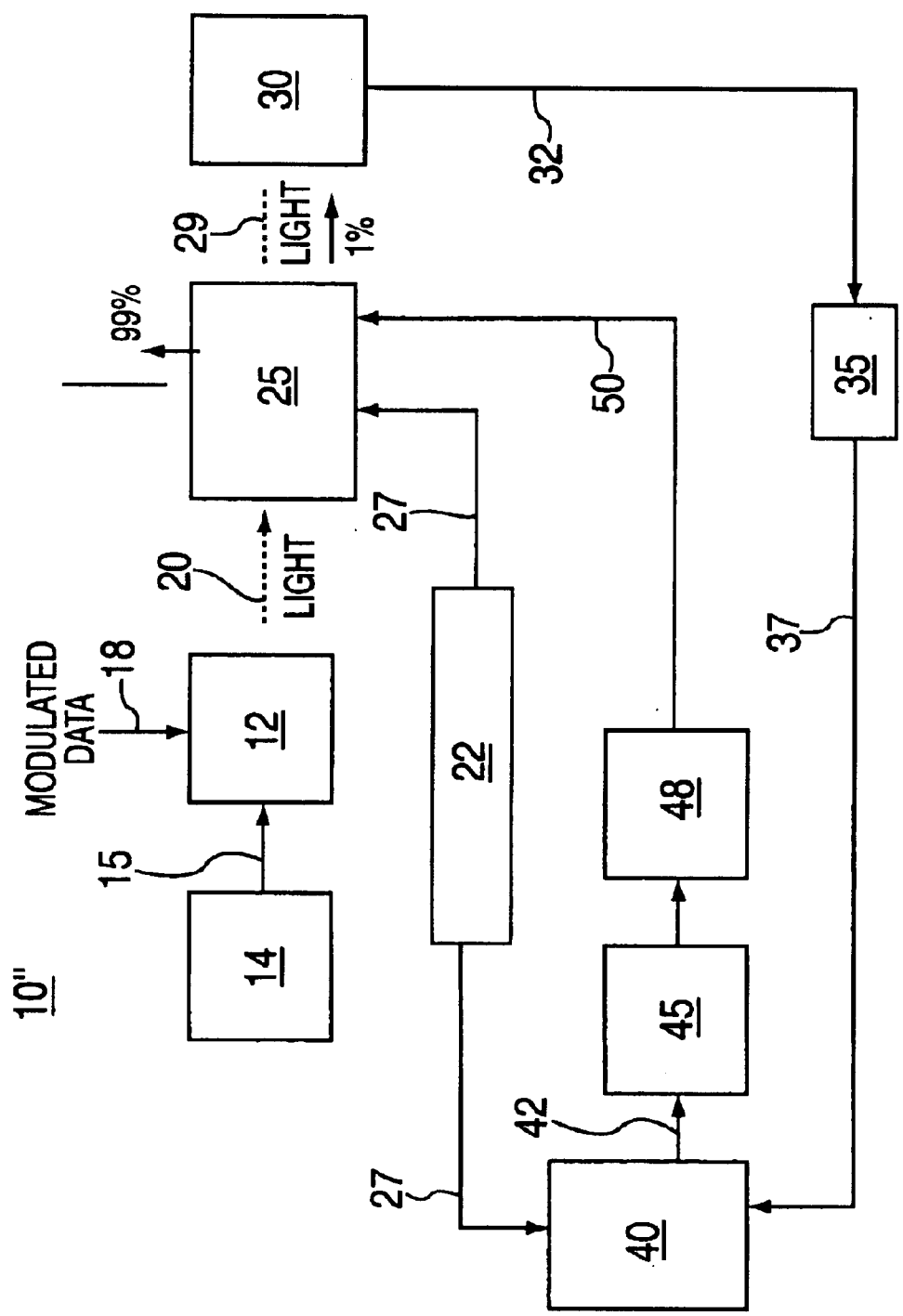
FIG. 2(c) is a general block diagram depicting the underlying system architecture for tuning tunable frequency selective devices such as a bandpass filter according to the principles of the present invention.

It should be understood that, as described in commonly-owned, co-pending U.S. patent application Ser. No. 09/865,256, the WLL servo-control system may be implemented for tuning tunable frequency selective devices such as a bandpass filter for a variety of optical network applications, including optical gain control circuits, such as provided in the present invention Thus, in the embodiment depicted in FIG. 2(c), the system 10″ comprises similar elements as system 10 (of FIG. 2(a)) including a bias voltage generator device 14 for applying a bias signal 15 to the laser diode 12 for generating an optical signal 20 having a peaked spectrum function. This signal 20 is input to a tunable frequency selective device 25, e.g., a tunable bandpass filter. As shown in FIG. 2(c), however, the sinusoidal dither/driver device 22 is implemented for modulating the peak center frequency of filter pass band with a small dither signal 27. A small amount of light 29 is tapped off the output of the filter 25 for input to the photodetector device, e.g., PIN diode 30, where the optical signal is converted to electrical signal 32, amplified by amplifier device 35, and input to the mixer device 40 which additionally receives the dither signal 27. The mixer device generates the vector cross product 42 of the amplified feedback signal 37 with the dither signal 27 and that result is low-pass filtered, and smoothed (e.g., integrated) by integrator device 48 to provide error signal 50, in the manner as will be discussed herein with reference to FIGS. 3–7. This error signal 50 may be a bi-polar signal and may be used to dynamically adjust the peak center frequency of the filter passband until it matches the center frequency of the laser signal input 20.

The operating principle of the WLL is further illustrated in the timing and signal diagrams of FIGS. 3–7. FIGS. 3(a)–3(c) particularly depicts the relationship between laser optical power as a function of wavelength for three instances of optic laser signals: a first instance (FIG. 3(a)) where the laser signal frequency center point 21 is less than the bandpass function centerpoint as indicated by the filter bandpass function 60 having centerpoint 62 as shown superimposed in the figures; a second instance (FIG. 3(b)) where the laser frequency center point 21 is aligned with the bandpass function centerpoint 62; and, a third instance (FIG. 3(c)) where the laser frequency center point 21 is greater than the bandpass function centerpoint 62. In each instance, as depicted in corresponding FIGS. 4(a)–4(c), the laser diode drive voltage signal 15 is shown dithered (a sinusoid) resulting in the laser wavelength dithering in the same manner. The dithered laser diode spectra passes through the filter, and is converted to electrical form by the PIN diode 30. In each instance of the laser signals depicted in FIGS. 3(a) and 3(c) having frequency centerpoints respectively less than and greater than the band pass filter centerpoint, it is the case that the dither harmonic spectra does not pass through the frequency peak or centerpoint of the bandpass filter. Consequently, the resulting output of the PIN diode is an electric sinusoidal signal of the same frequency as the dither frequency such as depicted in corresponding FIGS. 5(a) and 5(c). It is noted that for the laser signals at frequencies below the peak (FIG. 3(a)) the feedback error signal 32 corresponds in frequency and phase to the dither signal (FIG. 5(a)), however for the laser signals at frequencies above the peak (FIG. 3(c)) the feedback error signal 32 corresponds in frequency but is 180° opposite phase of the dither signal (FIG. 5(c)). Due to the bipolar nature of the feedback signal (error signal) for cases when the laser signal centerpoint is misaligned with the bandpass filter centerpoint, it is thus known in what direction to drive the laser diode (magnitude and direction), which phenomena may be exploited in many different applications. For the laser signal depicted in FIG. 3(b) having the laser frequency center point aligned with the bandpass function centerpoint, the dither harmonic spectra is aligned with and passes through the frequency peak (maximum) of the bandpass filter twice. That is, during one cycle (a complete round trip of the sinusoid dither signal), the dither signal passes though the centerpoint twice. This results in a frequency doubling of the dither frequency of the feedback signal 32, i.e., a unique frequency doubling signature, as depicted as PIN diode output 32′ in FIG. 5(b) showing an feedback error signal at twice the frequency of the dither frequency.

Thus, in each instance, as depicted in corresponding FIG. 5(b), the resulting feedback signal exhibits frequency doubling if the laser center wavelength is aligned with the filter center wavelength; otherwise it generates a signal with the same dither frequency, which is either in phase (FIG. 5(a)) or out of phase (FIG. 5(c)) with the original dither modulation. It should be understood that, for the case where there the laser center frequency is misaligned with the bandpass filter peak and yet there is exhibited partial overlap of the dither spectra through the bandpass filter peak (i.e., the centerpoint peak is traversed twice in a dither cycle), the PIN diode will detect partial frequency doubling laser at opposite phases depending upon whether the laser center frequency is inboard or outboard of the filter center frequency. Thus, even though partial frequency doubling is detected, it may still be detected from the feedback signal in which direction and magnitude the laser signal should be driven for alignment.

Referring now to FIGS. 6(a) and 6(c), for the case when the laser and filter are not aligned, the cross product signal 42 resulting from the mixing of the amplified feedback error with the original dither sinusoid is a signed error signal either at a first polarity (for the laser signals at frequencies below the bandpass filter centerpoint), such as shown in FIG. 6(a) or, at a second polarity (for the laser signals at frequencies above the bandpass filter centerpoint), such as shown in FIG. 6(c). Each of these signals may be rectified and converted into a digital output laser bias voltage signal 48 as shown in respective FIGS. 7(a) and 7(c), which are fed back to respectively increase or decrease the laser current (wavelength) in such a way that the laser center wavelength moves closer to the bandpass filter centerpoint. For the case when the laser and filter are aligned, the cross product generated is the frequency doubled signal (twice the frequency of the dither) as shown in the figures. Consequently, this results in a 0 V dc bias voltage (FIG. 7(b)) which will maintain the laser frequency centerpoint at its current wavelength value.

As described herein, an essential characteristic of a wavelength-locked loop is the ability to dynamically adjust the offset between the peak of a Gaussian filter function and the center wavelength of an optical signal passing through the filter. This may be used, for example, to optimize the alignment between the filter peak and the optical carrier. By deliberately inducing an offset from ideal alignment, this approach may be used as an external modulator for the optical signal. This offers benefits including a large modulation depth and high extinction ratio (limited only by the amplitude of the incident optical pulse, not by the modulator) and, may be used in conjunction with other methods, such as direct current modulation of a semiconductor laser diode. For example, the laser signal may be direct modulated to carry data, while the WLL is used to modulate a low data rate overhead signal for network management or other applications. The WLL also provides a convenient way to induce a low frequency dither modulation on the signal, which can be used for optical alignment or for other purposes, such as improving the bandwidth of dispersion modulated transmission systems.

In particular, the combination of external modulation of the optical signal and dither modulation provided by the WLL may be advantageously used for optical alignment applications, such as in large array fiber connectors where tolerance runout becomes an issue, or in optical disk drive storage systems where the additional modulation may be used to align laser beams with a disk while data is being read or written. This has applications to both multi-layer and double-sided CD ROM storage devices and other areas in which precise alignment of the optical beams is desired without using extra lasers or optics that increase the size of the package. That is, a single beam with different types of modulation may be used for both track alignment and read/write operations.

Depending on whether the filter used in the wavelength-locked loop is implemented in the amplitude or frequency domain, it is possible to use wavelength-locked loops to perform any combination of amplitude, phase, or frequency modulation, depending on the properties of the wavelength-selective filter element. While the WLL is applied for directly modifying the wavelength of the source laser, the filter is implemented for converting this into other types of modulation. For example, if the filter element is designed to only allow light of a certain wavelength to pass through unattenuated, and the wavelength of the incident light is varied using a WLL, then control of how much of the light is passed or blocked by the filter is provided. This is, in essence, amplitude modulation of the light. For phase modulation, the filter may incorporate a phase sensitive layer, such that by using the WLL to change the light wavelength, would also cause phase modulation of the transmitted light signal.

It is further possible to perform several different kinds of modulation at once. For example, the loop could be used to frequency modulate an optical signal at the same time that direct current modulation is used to amplitude modulate the signal. Or, multiple loops may be arranged in parallel to implement both types of modulation on the same optical signal. This has potential applications in holographic storage systems, which use both amplitude and phase information to store data; it may also be used as a control mechanism for writing holograms, or photorefractive optical memory elements. The feedback inherent in the wavelength-locked loop design insures precise control in all of these areas, and may be applicable to other designs as well.

Figure 10:
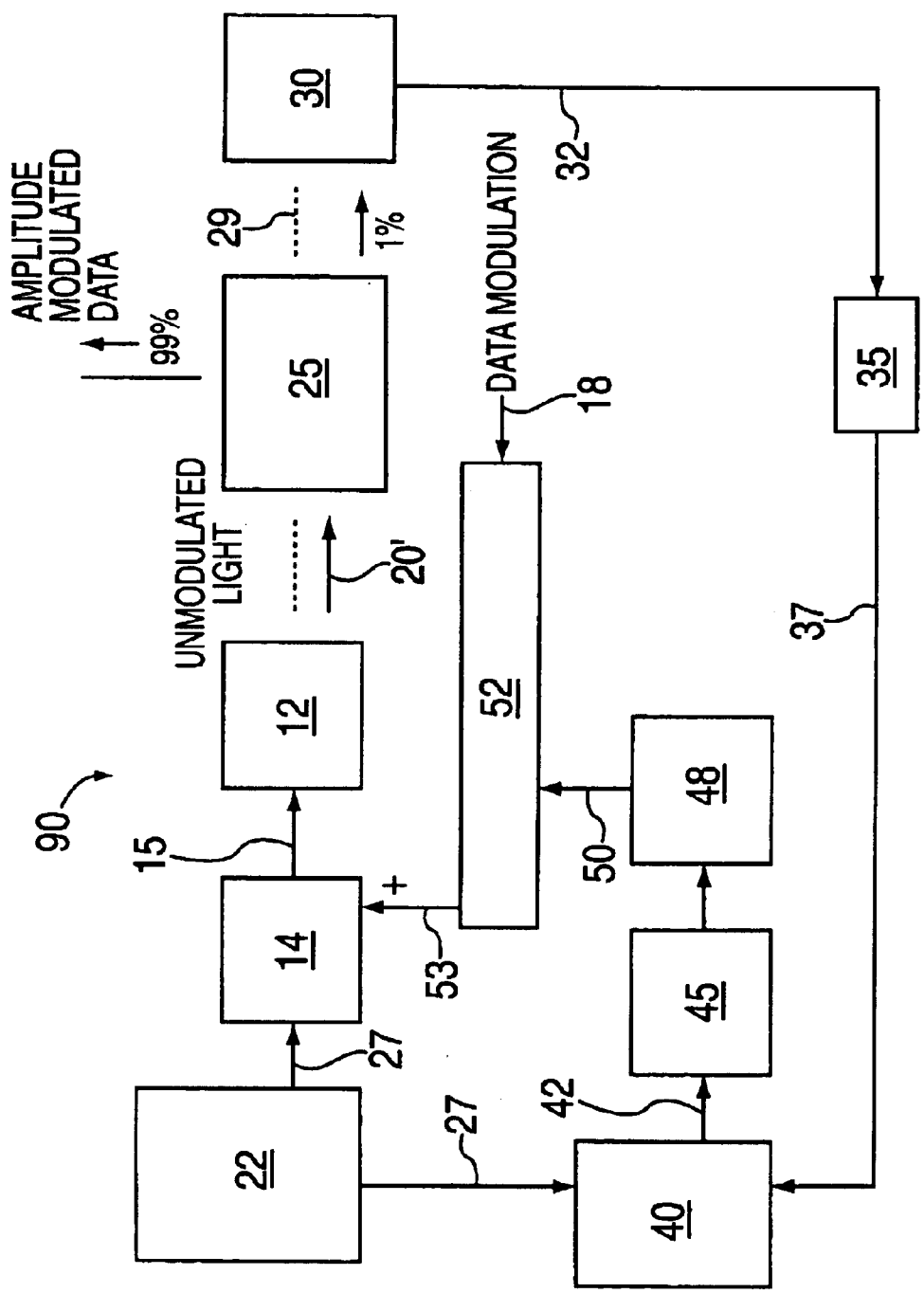
FIG. 10 illustrates the example wavelength-locked loop system architecture 90 of FIG. 2(b) modified to provide an optical modulation function.

For instance, the functional block diagram of FIG. 10 illustrates the example wavelength-locked loop system architecture 90 of FIG. 2(b) modified to provide an optical modulation function. In the embodiment depicted in FIG. 10, the laser diode element 12 is not direct current modulated by the data and the power of the optical output signal 20' remains constant; only the laser wavelength is modulated by the bias current. If the laser wavelength is adjusted to lie on the peaked center of the bandpass filter function, then the peak optical power is transmitted which corresponds to the case of a logical "1". If the laser wavelength is moved far from the filter center wavelength, then the minimal optical power or no optical power is transmitted which corresponds to the case of a logical "0". Driving the laser at constant optical power improves its reliability and extends the lifetime of the laser diode because as known, certain types of laser diodes, as well as gas lasers and other coherent optical sources, respond better to external modulation than to attempts to regulate their internal properties.

As explained herein, according to one aspect of the invention as depicted in FIG. 10, the laser voltage bias is modulated by a dithering current 27 from the dither signal generator 22 at a low modulation frequency. Variations in the laser bias produce a corresponding dither in the center wavelength of the laser output 20'. This light passes through a bandpass filter 25 whose center wavelength is, in general, different from the center wavelength of the laser diode (since the laser and filter are made with different manufacturing processes, tolerances, etc.) The light 29 emerging from the bandpass filter 25 is amplitude modulated by the mismatch between the laser center wavelength and the filter center wavelength. There is also some modulation of the light intensity due to the dithering of the laser center wavelength about its nominal position. The output light 29 from the filter passes through a beamsplitter (not shown), which samples a small portion of the light and forwards it to the photodetector 30. The detector's electrical output signal 32 is amplified and fed back to a control circuit 40, where it is multiplied by the original sinusoidal dither used to modulate the laser diode wavelength to result in the generation of the cross product of the two signals. By low pass filtering the result to remove higher order terms, and then integrating and digitizing the result, there is obtained a signal 50 which is proportional to the offset between the laser and filter center wavelengths.

This offset signal is a unique property in that it is a representation of whether the laser and filter are properly aligned, and if they are not, it provides both the amount and direction in which the laser center wavelength must be moved to become properly aligned with the filter. The relative alignment of the laser and filter determines whether the light emerging from the filter is large or small, i.e., a logical 1 or 0. However, as shown in the embodiment depicted in FIG. 10, the optional wavelength shifter device is substituted with a digital driver logic control element 52 which receives both the direct current modulated data 18 and the offset signal 50. Preferably, the digital driver logic control circuit 52 functions to compare the state of the optical output from the laser/filter combination with the desired state of a digital data sequence 18 being transmitted over the communication link. If it is desired to transmit a logical 1, then the laser and filter must be in alignment. If the offset signal 50 indicates they are already aligned, then the digital logic circuit output 53 is zero and no change is made to the state of the laser center wavelength. If they are not aligned, then the feedback signal 50 is used to determine in which direction and by what amount the drive current should be changed to bring them into alignment. This control signal 53 is then fed back into the voltage bias element 14 to produce the appropriate laser diode drive voltage 15. Similarly, if it is desired to transmit a logical 0, then the laser and filter must be out of alignment. If the feedback signal 50 indicates they are not aligned, then the digital logic circuit output 53 is zero and no further change is made in the laser state. If the feedback signal 50 indicates they are aligned, then the feedback signal is used to determine in which direction and by what amount the drive current should be changed to bring them out of alignment. This control signal 53 is then fed back into the laser diode drive voltage bias element 14 to produce the appropriate laser diode drive voltage 15. It is understood that a state machine which affects external amplitude modulation of the laser diode output power 55 from the optical splitter.

It should be understood that the system 90 of FIG. 10 generalizes to more than just a binary modulation system. That is, it is possible to implement multi-level signaling using the approach described. In the binary case, the transmitted output power is modulated to either a logic 0 (complete misalignment between the laser center wavelength and the filter) or a logic 1 (complete alignment). Various intermediate cases are also possible depending on the rolloff of the bandpass filter function, as the laser and filter combination may be adjusted to any state in between these two extremes. This has advantages in systems that employ multi-level digital signaling. For example, this may be advantageous for cable TV signals and as a multiplexing approach for 10 Gbit/s data links. Furthermore, this allows the modulator to function as a fast analog-to-digital converter (also known sometimes as a sigma-delta converter). If the data modulation input 18 shown in FIG. 10, is analog rather than digital, then the driver logic can be used to sample the value of this signal at any instant and compare it with a set of desired multi-level discrete signal levels. The analog signal is then quantized or digitized to the appropriate value, and the feedback signal 53 is used to adjust the laser/filter combination to produce a discrete optical output corresponding to the sampled analog signal. Thus, the embodiment of the invention depicted in FIG. 10 is not limited in its applications to digital data modulation only, but also to analog modulation, analog-to-digital conversion, or digital-to-analog conversion. These different cases may be realized by using the proper driver logic and lookup tables in the digital logic control circuit 52.

Figure 1:
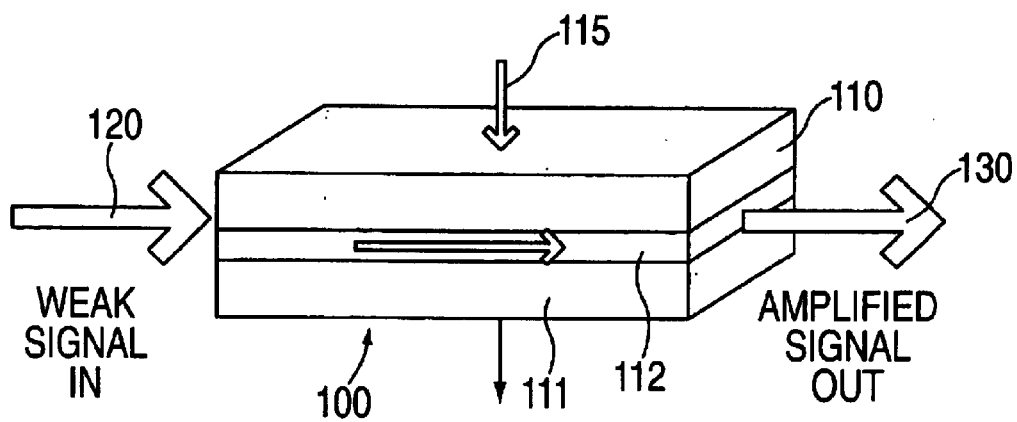
FIG. 1 is a block diagram illustrating the basic operating principle of a semiconductor optical amplifier.
Figure 11:
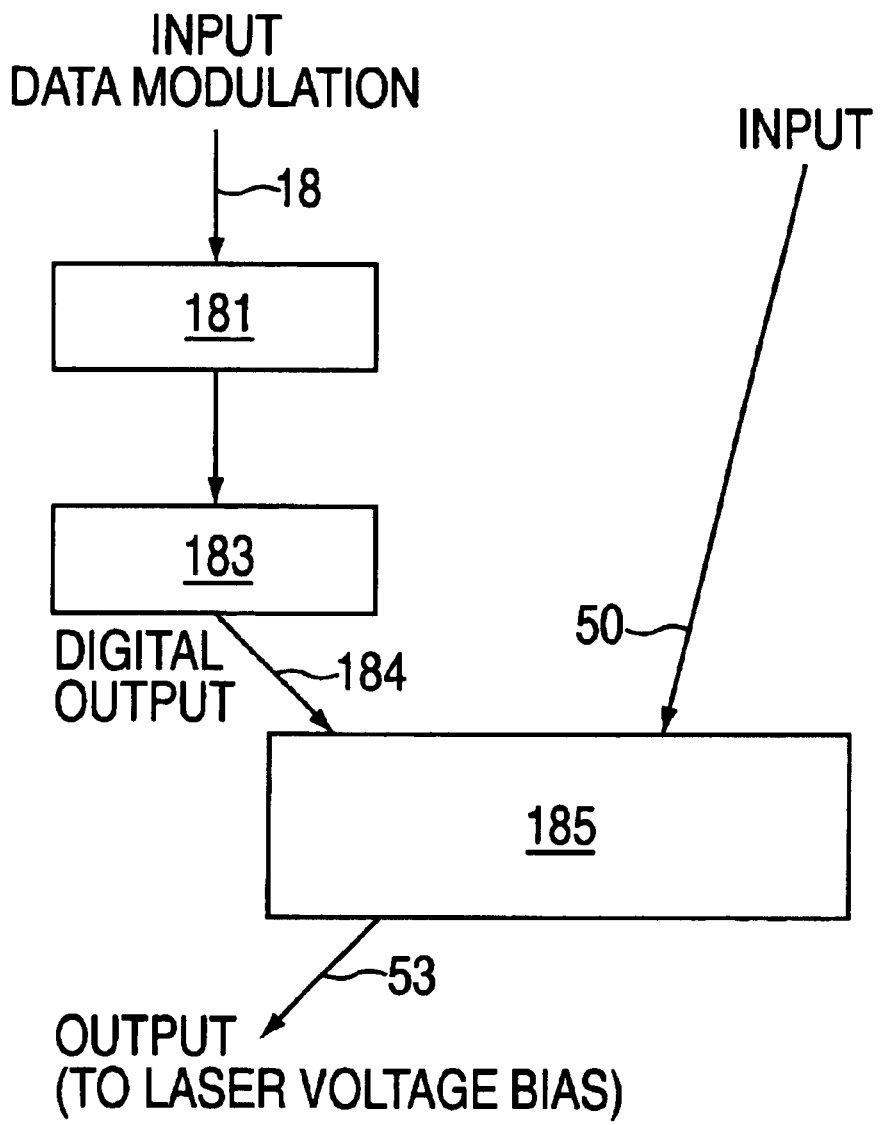
FIG. 11 is a flow diagram depicting the logic for performing A/D and D/A modulation.

FIG. 11 is a flow diagram depicting the logic for performing A/D and D/A modulation. As shown in FIG. 1, the input data modulation signal 18 is sampled at step 181 and the sampled points quantized at step 183 to form a digital output signal 184. At step 185, a comparison device receives the digital output and the error signal 50 generated by the WLL and utilizes these signals to generate one of several types of outputs dependent upon the application and the desired target output thereof. For instance, in an A/D conversion application, the desired target may comprise a desired discrete level. Alternately, the desired target may be a different signal level based on multi-level analog encoding (analog modulation). Furthermore, in a D/A conversion application, the desired target may be a sampled level taken from a desired analog signal. Regardless of the application, an output voltage signal 53 is generated that is used to adjust the bias voltage according to the amount of error 50 determined by the WLL.

Figure 8:
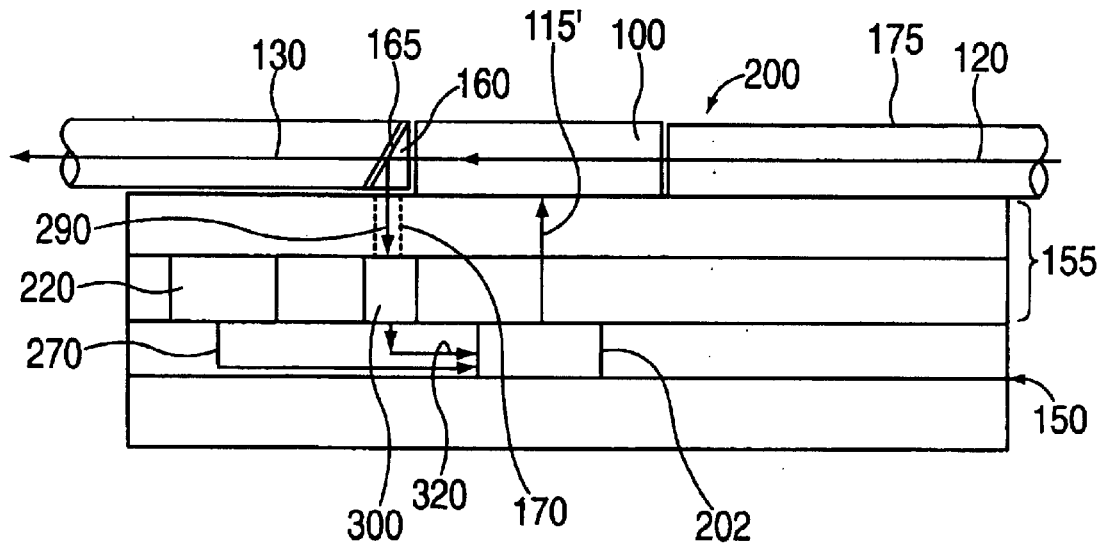
FIG. 8 is an exemplary schematic diagram of the SOA invention depicting how it may be integrated on a multilayer silicon chip integrated package.
Figure 9:
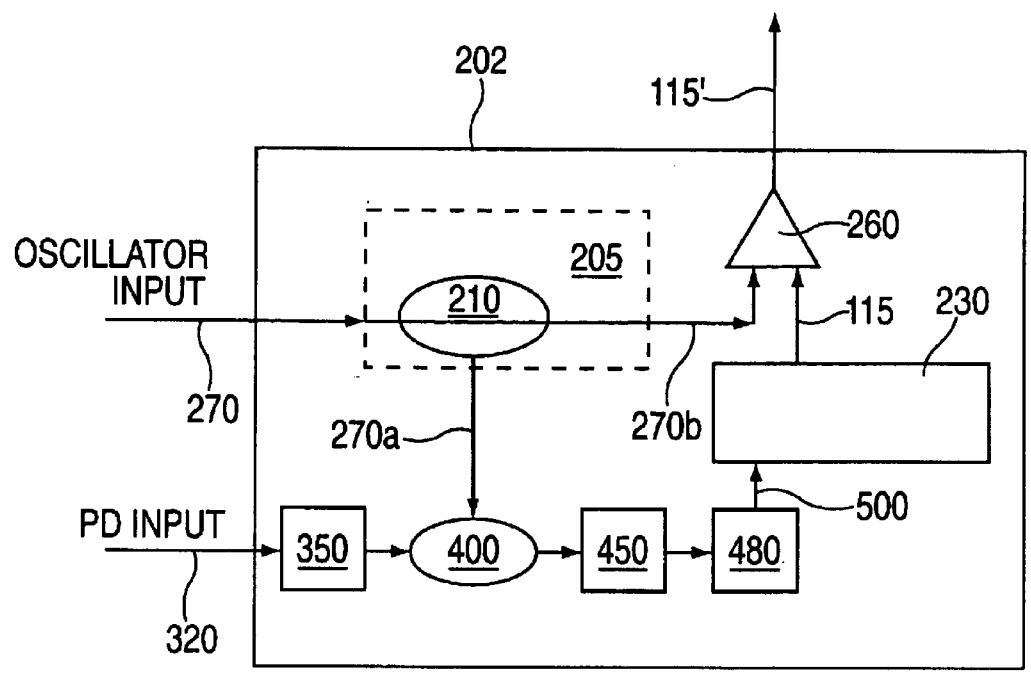
FIG. 9 is a detailed circuit diagram depicting the components of the ASIC 202 that implement the WLL control function for the SOA according to the invention.

The system for stabilizing the output of an SOA and enabling tracking of the center wavelength of the amplified signal to the peak of an optical filter passband according to a further aspect of the present invention is now described with respect to FIGS. 8 and 9. FIG. 8 is an exemplary schematic diagram of the invention depicting how it may be integrated on a multilayer silicon chip integrated package 200. Note that the elements of the invention are shown spread across multiple layers 155 of the substrate 150 for ease of representation; in practice, these layers may be combined into a single substrate layer or, split across even more layers. An optical surface waveguide 175 is used to couple light indicated by dashed lines 120 into and out of the SOA device 100. As shown in FIG. 8, the SOA includes an angled output facet 160 for preventing back reflections of light into the SOA, which could induce intensity noise on the amplified optical signal 130. The angled facet 160 is coated with a multilayer thin film filter 165 including many layers (e.g., tens to hundreds) of alternating refractive index, each one-quarter of the desired center wavelength in thickness. The angled facet 160 will naturally reflect a small percentage of the light 290 which is guided through a waveguide channel or optical via 170 in the substrate to a photodiode (PD) detector 180. The amount of light 290 that may be reflected from the angled facet may range anywhere between one percent (1%) to five percent (5%) of the optical output signal 130, however, skilled artisans will appreciate an amount of reflected light 290 above the noise level that retains the integrity of the output signal including a dither modulation characteristic, as will be explained, should be reflected out. This reflected signal is representative of the signal modulation intensity of the output signal 130.

As further shown in FIG. 8 is provision of an application specific integrated circuit (ASIC) device 202, shown embedded on an internal wiring plane 155 within the package 200, that provides and controls a modified bias signal 115' input to the SOA 100 as will be described in greater detail herein. For purposes of clarity, the voltage supply and other circuit devices of the ASIC have been omitted from FIG. 8. Specifically, the ASIC 202 receives one input from an external oscillator 220 which generates a low frequency dither modulation signal 270 (e.g. a sinusoidal signal in the kHz frequency range or less). As will be described in greater detail, the ASIC imposes this low frequency modulation signal 270 on the SOA bias current 115 to form a modified bias signal 115', so that the operating center wavelength of the SOA will dither by a corresponding amount. The portion 290 of the amplified output light that passes through the thin film interference filter 160 is converted by photodiode detector 300 (e.g., a P-I-N diode) into an electric feedback signal 320 representing the intensity (wavelength) modulation. Preferably, the dither modulation frequency is chosen to be low enough to be out of the passband of the data being carried on the link (it should be understood that such low frequency outband modulation would ultimately be filtered out at the receiver end of the link). The modulated light 290 is then incident on the photodiode 300, which produces an output current 320 proportional to the dither signal. The PD output 320 is additionally provided to the ASIC device 202.

FIG. 9 is a detailed circuit diagram depicting the components of the ASIC 202 that implement the WLL control function for the SOA according to the invention. As illustrated in FIG. 9, the ASIC includes a receiver device 205 for receiving the dither oscillation signal 270. The ASIC additionally includes an RF splitter device 210 for splitting the dither oscillation signal 270 into two portions: 1) a first portion 270a of which is to be mixed with the feedback signal 320 from the PD device, in the manner as will be explained; and, 2) a second portion 270b which is input to a combiner circuit 260 for modulating an input bias current 115 to product the dither modulated bias current 115' input to the SOA. Specifically, the first dither oscillation signal portion 270a is input to an RF mixer device 400 which additionally receives the PD feedback signal which has been amplified by amplifier device 350. The RF mixer mixes these to signal to produce a vector cross-product result 420 that is input to an integrator device 450 for filtering and a digitizer device 480. The output of the digitizer is a control signal 500 that is proportional to the amount of offset between the center frequency of the optical signal 120 passed through SOA 100 and the pass band center frequency of the thin film interference filter 160. As described herein with respect to FIGS. 3(a)–7(c), this error signal 500 may be positive or negative depending on which direction the SOA center frequency must be moved in order to better align with the passband center frequency of the filter 160. If the two center frequencies are optimally aligned, this feedback control signal 500 is zero. It should be understood that the signal level may be readjusted with the suitable electronic circuits (not shown) so that the zero state actually corresponds to some small level of signal bias, in order to improve operation of the ASIC circuitry.

As further shown in FIG. 9, the ASIC has been preprogrammed with a lookup table 230 comprising the SOA device's 's measured current-output wavelength characteristic curve (not shown). With the SOA device current-output wavelength characteristic information, the ASIC 202 enables adjustment of the bias voltage (or current) 115 on the SOA by providing a dc offset 155 that will accordingly move the SOA's center wavelength into optimal alignment with the filter bandpass in accordance with the error signal 500. Particularly, the lookup table 230 is programmed to provide the mapping of the difference between the desired wavelength and the actual wavelength, as measured by the error signal input 500, and the dc bias current offset for input to the SOA device that will enable matching of the wavelengths. It should be understood that a current limiter device (not shown) in the SOA 202 operates to prevent non-linear effects in the SOA and avoid SOA saturation which may occur due to excessive drive voltage.

The active feedback loop comprising WLL components including the dither oscillator, photodetector, and ASIC components quickly performs compensation for dynamic changes in the state of these signals, as well as compensation for slower effects such as thermal and aging variations. Thus, the efficiency of the SOA is improved because the feedback loop overcomes the high output loss incurred by the thin film filter's misalignment with the SOA optical signal wavelength's peaked function. This, in turn, overcomes any insertion loss into the SOA.

Many levels of integration are possible using the approach illustrated in FIGS. 8 and 9; in principle, the SOA, waveguides, oscillator, PD and ASIC functions may be combined into a single silicon chip to facilitate building optical amplification into an optical communication link card design.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A system for improving gain efficiency of a semiconductor optical amplifier device receiving an input optical signal to be amplified, and an input bias signal, and amplifying said input signal to generate an amplified output optical signal having a peaked spectrum function including a center wavelength according to said input bias signal, said system comprising:

an optical filter element located at the output of said semiconductor optical amplifier device for receiving and transmitting said amplified output optical signal, said optical filter element exhibiting a peaked passband function including a center wavelength; and, a wavelength-locked loop servo-control circuit for controlling said input bias signal in a manner to enable real time mutual alignment of said amplified output optical signal center wavelength with said optical filter having said peaked passband function so that said output optical signal is maximally transferred through said optical filter element, thereby resulting in increased semiconductor optical amplifier gain characteristic.

2. The system for improving gain efficiency of a semiconductor optical amplifier as claimed in claim 1, wherein said wavelength-locked loop servo-control circuit comprises:

mechanism for applying a dither modulation signal at a dither modulation frequency to said input bias signal, and inputting said dither modulated bias signal to said semiconductor optical amplifier to generate a dither modulated amplifier output signal;

mechanism for converting said portion of said dither modulated amplifier output signal into an electric feedback signal;

mechanism for continuously comparing said feedback signal with said dither modulation signal and generating an error signal representing a difference between a frequency characteristic of said feedback signal and a dither modulation frequency; and mechanism for automatically adjusting a peaked spectrum function of said amplifier output signal according to said error signal, wherein said center wavelength of each said amplifier output signal and said peaked passband function of optical filter become aligned when said frequency characteristic of said feedback signal is two times said dither modulation frequency.

3. The system for improving gain efficiency of a semiconductor optical amplifier as claimed in claim 2, wherein said mechanism for automatically adjusting a peaked spectrum function of said amplifier output signal comprises a level control device for receiving said error signal and dynamically adjusting said input bias signal according to a value of error signal.

4. The system for improving gain efficiency of a semiconductor optical amplifier as claimed in claim 3, wherein said level control device includes look-up table comprising values of input bias currents and corresponding wavelength characteristics of said semiconductor optical amplifier, said center wavelength of said amplifier output signal being adjusted in accordance with input bias current changes as modified by said error signal value.

5. The system for improving gain efficiency of a semiconductor optical amplifier as claimed in claim 2, wherein said converting mechanism is a photodetector device.

6. The system for improving gain efficiency of a semiconductor optical amplifier as claimed in claim 5, wherein said photodetector device is a p-i-n diode.

7. The system for improving gain efficiency of a semiconductor optical amplifier as claimed in claim 3, wherein said device for comparing includes a mixer device capable of combining said converted feedback signal with said dither modulation signal and generating a cross-product signal having components representing a sum and difference at dither frequencies.

8. The system for improving gain efficiency of a semiconductor optical amplifier as claimed in claim 7, further including:

low-pass filter device for filtering said cross-product signal; and integrator circuit for averaging said output cross-product signal to generate said error signal, whereby said error signal is positive or negative depending on whether a center wavelength of said amplifier output signal is respectively less than or greater than said center wavelength of said optical filter.

9. The system for improving gain efficiency of a semiconductor optical amplifier as claimed in claim 8, further including digitizer device for digitizing said error signal prior to input to said level control device.

10. The system for improving gain efficiency of a semiconductor optical amplifier as claimed in claim 2, wherein said optical filter element reflects a portion of said dither modulated amplifier output signal for input to said converting mechanism.

11. The system for improving gain efficiency of a semiconductor optical amplifier as claimed in claim 10, wherein said wavelength-locked loop servo-control circuit is formed in a semiconductor substrate including said semiconductor optical amplifier, said reflected portion of said dither modulated amplifier output signal being forwarded to said converting mechanism though a via formed in said semiconductor substrate.

12. The system for improving gain efficiency of a semiconductor optical amplifier as claimed in claim 7, wherein said wavelength-locked loop servo-control circuit further comprises a device for combining a dither modulation signal with said adjusted input bias signal for input to said semiconductor optical amplifier.

13. The system for improving gain efficiency of a semiconductor optical amplifier as claimed in claim 12, further including a device for receiving said dither modulation signal and splitting said dither modulation signal into a first dither modulation signal portion for combination with said adjusted input bias signal, and into a second dither modulation signal portion for input to said mixer device.

14. A method for improving gain efficiency in a semiconductor optical amplifier comprising the steps of:
   a) receiving an input optical signal to be amplified;
   b) providing a bias signal for input to said semiconductor optical amplifier and generating an amplified output optical signal from said input optical signal having a peaked spectrum function including a center wavelength according to an input bias signal value;
   c) providing an optical filter element for passing output optical signals amplified by said semiconductor optical amplifier device, said optical filter element exhibiting a peaked passband function including a center wavelength; and,
   d) providing automatic real-time mutual alignment of said center wavelength of said amplified optical signal output with said optical filter having said peaked passband function so that said output optical signal is maximally transferred through said optical filter element, thereby resulting in increased semiconductor optical amplifier gain.

15. The method as claimed in claim 14, wherein said step d) of providing real-time mutual alignment further comprises the steps of:
   applying a dither modulation signal at a dither modulation frequency to said semiconductor optical amplifier for generating an amplified optical signal output exhibiting a dither modulation;
   obtaining a portion of said dither modulated amplified optical signal passed from said optical filter and converting said dither modulated amplified optical signal output portion into a feedback signal;
   continuously comparing said feedback signal with said dither modulation signal and generating an error signal representing a difference between a frequency characteristic of said feedback signal and a dither modulation frequency; and
   adjusting said peaked spectrum function of said amplified optical signal output by dynamically adjusting said input bias signal level according to said error signal, wherein said center wavelength of said amplified optical signal output and said peaked passband function of optical filter element become aligned when said frequency characteristic of said feedback signal is two times said dither modulation frequency.

16. The method as claimed in claim 14, further including the step of providing a bias voltage level control circuit for providing said input bias voltage to said semiconductor optical amplifier, said dynamically adjusting step further including: applying said error signal to said bias voltage level control circuit for adjusting a center wavelength characteristic of said amplified optical signal output.

17. The method as claimed in claim 16, wherein said continuously comparing step includes the steps of:
   combining said converted feedback signal with said dither modulation signal and generating a cross-product signal having components representing a sum and difference at dither frequencies:
   filtering said output cross-product signal; and
   averaging said output cross-product signal to generate said error signal, said error signal being positive or negative depending on whether a center wavelength of said amplified optical signal output is respectively less than or greater than a center wavelength of said peaked passband optical filter function.

18. The method as claimed in claim 16, wherein said bias voltage level control circuit includes a look-up table comprising values of input bias currents and corresponding wavelength characteristics of said semiconductor optical amplifier, said dynamically adjusting step further including the steps of: looking up corresponding input bias current values according to input error signal values and adjusting said bias current applied to said semiconductor optical amplifier according to a look-up value.

19. The method as claimed in claim 16, wherein said step of applying a dither modulation signal at a dither modulation frequency includes the step of: combining a dither modulation signal with said adjusted input bias signal for input to said semiconductor optical amplifier.

20. The method as claimed in claim 17, further including the step of:
   splitting said dither modulation signal into a first dither modulation signal portion for combination with said adjusted input bias signal, and into a second dither modulation signal portion for combination with said converted feedback signal.

21. An apparatus for modulating an optical signal characterized as a peaked spectrum function having a center wavelength, said apparatus included in an optical system employing a wavelength selective device implementing a peaked passband function having a center wavelength for passing said optical signal, said apparatus comprising:
   mechanism for applying a dither modulation signal at a dither modulation frequency to said optical signal, and inputting the dither modulated optical signal to said wavelength selective device;
   mechanism for converting a portion of said dither modulated optical signal to a feedback signal;
   mechanism for continuously comparing a frequency characteristic of said feedback signal with said dither modulation signal and generating an error signal representing a current offset amount between said peaked spectrum function center wavelength of said optical signal and said peaked passband function center wavelength of said wavelength selective device, said current offset amount indicating a degree of modulation of said optical signal communicated in said system;

device for receiving a data information signal to be communicated in said optical system and comparing a difference between a desired offset amount associated with each data information signal to be communicated and said current offset amount;

mechanism for dynamically adjusting the center wavelength of said optical signal according to said offset difference for achieving said desired offset amount between said peaked spectrum function center wavelength of said optical signal and said peaked passband function center wavelength of said wavelength selective device, wherein said optical signal is modulated according to said desired offset amount.

22. The apparatus for modulating an optical signal as claimed in claim 21, wherein said optical signal is employed in a an optical system including:

an optical signal generator for generating said optical signal; and, a bias control circuit for providing a bias control signal to said optical signal generator for controlling a wavelength characteristic of said optical signal, wherein said mechanism for adjusting said optical signal includes applying a signal for achieving said desired offset amount to said bias control circuit for adjusting a center wavelength characteristic of said laser signal.

23. The apparatus for modulating an optical signal as claimed in claim 22, wherein said optical signal is one of amplitude, frequency or phase modulated according to said desired offset amount.

24. The apparatus for modulating an optical signal as claimed in claim 23, wherein a data information signal to be communicated in said optical system includes a digital logic level corresponding to a logic 1, said desired offset amount being a value capable of modulating said optical signal according to a logic 1.

25. The apparatus for modulating an optical signal as claimed in claim 23, wherein a data information signal to be communicated in said optical system includes a digital logic level corresponding to a logic 0, said desired offset amount being a value capable of modulating said optical signal according to a logic 0.

26. The apparatus for modulating an optical signal as claimed in claim 23, wherein a data information signal to be communicated in said optical system includes multi-level digital logic signals, said desired offset amount comprising values capable of modulating said optical signal according to said a multi-level digital logic signals.

27. The apparatus for modulating an optical signal as claimed in claim 23, wherein a data information signal to be communicated in said optical system includes an analog signal, said receiving device further sampling said analog data information signal at sampling points and determining a desired offset amount associated with each sampled data point, said optical signal being modulated according to said desired offset amount associated with each sampled point, wherein said optical signal is modulated according to said analog signal.

28. The apparatus for modulating an optical signal as claimed in claim 27, wherein said desired offset amount determined at each sampling point corresponds to a digital logic value, said apparatus functioning as an analog-to-digital converter.

29. The apparatus for modulating an optical signal as claimed in claim 27, wherein said wavelength selective device comprises a bandpass filter.

30. The apparatus for modulating an optical signal as claimed in claim 27, wherein said optical signal is a laser signal, said optical signal generator comprising a laser diode device.

31. The method for modulating an optical signal characterized as a peaked spectrum function having a center wavelength and employed in an optical system including a wavelength selective device implementing a peaked passband function having a center wavelength for passing said optical signal, said method comprising the steps of:

a) applying a dither modulation signal at a dither modulation frequency to said optical signal, and inputting the dither modulated optical signal to said wavelength selective device;

b) converting a portion of said dither modulated optical signal to a feedback signal;

c) continuously comparing a frequency characteristic of said feedback signal with said dither modulation signal and generating an error signal representing a current offset amount between said peaked spectrum function center wavelength of said optical signal and said peaked passband function center wavelength of said wavelength selective device, said current offset amount indicating a degree of modulation of said optical signal communicated in said system;

d) receiving a data information signal to be communicated in said optical system and comparing a difference between a desired offset amount associated with each data information signal to be communicated and said current offset amount;

e) dynamically adjusting the center wavelength of said optical signal according to said offset difference for achieving said desired offset amount between said peaked spectrum function center wavelength of said optical signal and said peaked passband function center wavelength of said wavelength selective device, wherein said optical signal is modulated according to said desired offset amount.

32. The method for modulating an optical signal as claimed in claim 31, wherein said optical signal is employed in a an optical system including:

an optical signal generator for generating said optical signal; and, a bias control circuit for providing a bias control signal to said optical signal generator for controlling a wavelength characteristic of said optical signal, wherein said step e) of adjusting said optical signal includes the step of: applying a signal for achieving said desired offset amount to said bias control circuit for adjusting a center wavelength characteristic of said laser signal.

33. The method for modulating an optical signal as claimed in claim 32, wherein said optical signal is one of amplitude, frequency or phase modulated according to said desired offset amount.

34. The method for modulating an optical signal as claimed in claim 33, wherein a data information signal to be communicated in said optical system includes a digital logic level corresponding to a logic 1, said desired offset amount being a value capable of modulating said optical signal according to a logic 1.

35. The method for modulating an optical signal as claimed in claim 33, wherein a data information signal to be communicated in said optical system includes a digital logic level corresponding to a logic 0, said desired offset amount being a value capable of modulating said optical signal according to a logic 0.

36. The method for modulating an optical signal as claimed in claim 33, wherein a data information signal to be communicated in said optical system includes multi-level digital logic signals, said desired offset amount comprising values capable of modulating said optical signal according to said a multi-level digital logic signals.

37. The method for modulating an optical signal as claimed in claim 33, wherein a data information signal to be communicated in said optical system includes an analog signal, said receiving device further sampling said analog data information signal at sampling points and determining a desired offset amount associated with each sampled data point, said optical signal being modulated according to said desired offset amount associated with each sampled point, wherein said optical signal is modulated according to said analog signal.

38. The method for modulating an optical signal as claimed in claim 37, wherein said desired offset amount determined at each sampling point corresponds to a digital logic value, said apparatus functioning as an analog-to-digital converter.

* * * * *